United States Patent [19]
Fuller

[11] Patent Number: 5,804,846
[45] Date of Patent: Sep. 8, 1998

[54] PROCESS FOR FORMING A SELF-ALIGNED RAISED SOURCE/DRAIN MOS DEVICE AND DEVICE THEREFROM

[75] Inventor: Robert T. Fuller, Melbourne Beach, Fla.

[73] Assignee: Harris Corporation, Melbourne, Fla.

[21] Appl. No.: 654,393

[22] Filed: May 28, 1996

[51] Int. Cl.$^6$ .................................................. H01L 29/82
[52] U.S. Cl. ......................... 257/252; 257/382; 257/412; 257/506; 257/623; 257/742; 257/752; 257/773; 438/184; 438/230; 438/297; 438/300
[58] Field of Search .................................. 257/742, 752, 257/773, 382, 412, 506, 623, 252; 438/151, 184, 230, 297, 300

[56] References Cited

U.S. PATENT DOCUMENTS

| | | | |
|---|---|---|---|
| 4,822,749 | 4/1989 | Flanner et al. . | |
| 4,983,536 | 1/1991 | Bulat et al. | 257/742 |
| 5,057,902 | 10/1991 | Haskell | 257/752 |
| 5,397,722 | 3/1995 | Bashir et al. . | |
| 5,439,839 | 8/1995 | Jang . | |

OTHER PUBLICATIONS

M. Sekine et al., "Self–Aligned Tungsten Strapped Source/Drain and Gate Technology Realizing The Lowest Sheet Resistance For Sub–Quarter Micron CMOS", IEEE, Japan, 1994, pp. 493–496.

W. T. Lynch, "Self–Aligned Contact Schemes For Source–Drains In Submicron Devices", IEEE, New Jersey, 1987, pp. 354–357.

C. K. Lau et al., "A Super Self–Aligned Source/Drain MOSFET", IEEE, California, 1987, pp. 358–361.

*Primary Examiner*—Edward Wojciechowicz
*Attorney, Agent, or Firm*—Jaeckle Fleischmann & Mugel, LLP

[57] ABSTRACT

The present invention is directed to a process for forming a self-aligned raised source/drain MOS device comprising a planarized metal layer, preferably tungsten, overlying a source, a drain, and a gate that is provided on both sides with an insulating spacer to electrically isolate it from the source and drain. The planarized tungsten layer comprises a first portion whose lower surface is in contact with a polysilicon layer of the gate. The lower surface of each of the second and third portions of the tungsten layer is in contact with the source and drain, respectively. The second and third portions are insulated from the first portion by the insulating spacers, and the upper surfaces of all the portions comprise a coplanar surface. Planarization of the deposited metal layer thus provides ohmic contact at substantially the same level to the source, drain, and gate. In a self-aligned raised source/drain MOS device formed by the process of the invention, the second and third portions of the planarized metal layer preferably extend laterally over the field oxide and are characterized by an upper:lower surface width ratio of from about 2:1 to 4:1.

49 Claims, 5 Drawing Sheets

PROCESS FOR FORMING A SELF-ALIGNED RAISED SOURCE/DRAIN MOS DEVICE AND DEVICE THEREFROM

FIELD OF THE INVENTION

This invention relates, in general, to semiconductor devices, and more particularly to a process for forming a raised self-aligned source/drain MOS device, and a device obtained therefrom.

BACKGROUND OF THE INVENTION

In conventional CMOS processing, the active silicon regions are contacted through openings in the overlying oxide insulating layer. Metal used for forming electrical contacts must overlay these openings sufficiently to prevent damage to the active regions during patterning of the metal. Furthermore, the active source and drain regions must be large enough to accommodate misalignment during patterning. The dimensions of these active region result in large source/drain to substrate capacitances that seriously degrade the performance of the circuit. Furthermore, these conventional processing methods are unsuitable for fabricating devices of submicron size.

To overcome these problems, many schemes have been proposed to provide self-aligned source/drain contacts in submicron devices. Various proposals for providing local interconnect layers, typically of TiN or polysilicon, to interface with a raised source and drain. are described in Lynch, "Self-Aligned Contact Schemes for Source-Drains in Submicron Device," IEDM, 1987, pages 354–357, the disclosure of which is incorporated herein by reference.

Sekine et al., "Self-Aligned Tungsten Strapped Source/Drain and Gate Technology Realizing the Lowest Sheet Resistance for Sub-quarter Micron CMOS," IEDM, 1994, pages 493–496, the disclosure of which is incorporated herein by reference, describes a process for fabricating a grooved gate structure that entails the use of nitride spacers and selective tungsten chemical vapor deposition.

Figure 1:
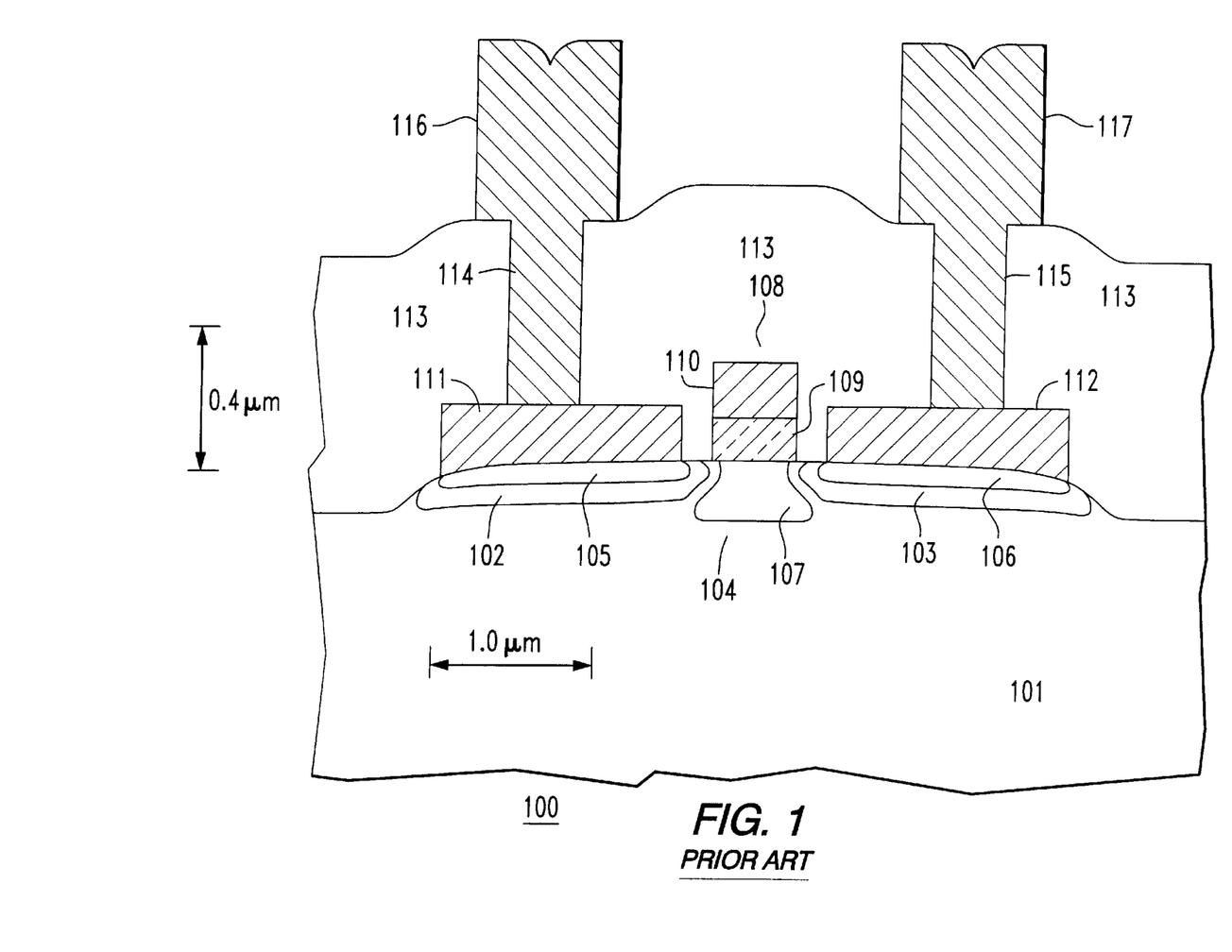
FIG. 1 is a cross-section of a prior art MOS device.

FIG. 1 is a cross-section, substantially to scale, of a prior art self-aligned raised source/drain MOS device 100 constructed by computer simulation of the process described in Sekine et al. The simulation was carried out for a device having an 0.5 $\mu$m-wide gate with a 0.1 $\mu$m-thick layer of gate polysilicon and standard source/drain dopants, using the ATHENA process simulator program available from Silvaco Co. A substrate 101 includes a source 102, a drain 103, and a gate region 104. The source 102 and drain 103, as depicted in FIG. 1, each has a width of about 1.8 $\mu$m. Source 102 and drain 103 each comprises a highly doped region 105 and 106, respectively, and a buried channel 107 is included within gate region 104. Gate 108 includes a polysilicon layer 109 and a selectively deposited tungsten layer 110 overlying layer 109.

Contacting source 102 and drain 103 are selectively deposited tungsten interconnect layers 111 and 112, respectively. A thick insulating layer 113 of silicon dioxide is formed over source 102 and drain 103, their respective tungsten interconnect layers 111 and 112, and gate 108. Contact holes 114 and 115 through oxide insulating layer 113 enable external metal contacts 116 and 117 to connect with tungsten layers 111 and 112, respectively.

Nitride spacers are employed together with a selective silicon growth technique that provides contact with a selective tungsten plug in a fabrication sequence described in Lau et al., "A Super Self-Aligned Source/Drain MOSFET," IEDM, 1987, pages 358–361, the disclosure of which is incorporated herein by reference.

Self-aligned source/drain contact processes are also described in Flanner et al., U.S. Pat. No. 4,822,749; Bashir et al., U.S. Pat. No. 5,397,722; and Jang, U.S. Pat. No. 5,439,839, the disclosures of which are incorporated herein by reference. The process of Flanner et al. includes a selective deposition of a first layer of tungsten over exposed silicon device surfaces, followed by a selective deposition of a second tungsten layer on a nucleating layer and the first tungsten layer. The process described in Bashir et al. utilizes a polysilicon conducting layer. The MOS device-forming method of Jang includes heavily doping lightly doped source and drain regions following removal of overlying nitride spacers, then forming source and drain interconnects over the field oxide regions and/or the gate dielectric.

SUMMARY OF THE INVENTION

The present invention is directed to a process. for forming a self-aligned raised source/drain MOS device. A polysilicon layer is formed on a gate dielectric surface of a semiconductor substrate that comprises an active region disposed between spaced apart field oxide regions and comprising a gate channel region that includes the dielectric surface and source and drain regions on either side of the channel region. A first impurity is implanted through a portion of the polysilicon layer overlying the gate channel region into the substrate to form a shallow buried channel between the source and drain regions. A silicon nitride layer is deposited on the polysilicon layer, and portions of the nitride and polysilicon layers overlying the source and drain regions are selectively removed to define a gate stack structure of nitride and polysilicon layers over the gate channel region. A second impurity is implanted in the exposed regions to form a source and a drain, and a first insulating layer is deposited over the source and drain and over the silicon nitride layer of the gate stack. Portions of this insulating layer overlying the source, drain and gate silicon nitride layer are selectively removed, leaving sidewall insulating spacers on both sides of the polysilicon and thereby forming a sidewall sealed gate.

The silicon nitride layer overlying the gate polysilicon layer is removed,. and a layer of metal, preferably tungsten, is deposited over the field oxide, source, drain, gate, and insulating spacers. The tungsten layer is planarized to expose the sidewall insulating spacers and form a planarized tungsten layer having a substantially planar upper surface. A first portion of the planarized tungsten layer has a lower surface in contact with the gate polysilicon and is electrically isolated by the insulating sidewall spacers from adjacent portions of the planarized layer. A portion of the planarized tungsten layer overlying the field oxide is selectively removed to form second and third portions whose lower surfaces are in contact with the source and the drain, respectively. The upper surfaces of the first, second, and third portions of the planarized tungsten layer comprise a coplanar surface. Thus, planarization of the deposited metal layer provides raised ohmic contacts to the source, drain, and gate that are all at substantially the same level.

Also in accordance with the invention, a self-aligned raised source/drain MOS device comprises a planarized tungsten layer overlying a source, a drain, and a gate that is provided on either side with a sidewall insulating spacer to electrically isolate it from the source and drain.

The planarized tungsten layer comprises a first portion whose lower surface is in contact with a polysilicon layer of the gate. The lower surface of the second and third portions of the tungsten layer are in contact with the source and drain, respectively. The second and third portions are electrically isolated from the first portion by the sidewall insulating spacers, and the upper surfaces of the first, second, and third portions comprise a coplanar surface.

The process of the present invention and the MOS device produced therefrom yield significant advantages over the prior art. The process includes blanket deposition of a tungsten layer that provides not only laterally extended contacts to a source and drain of submicron dimensions but also a low resistance cladding layer over the gate polysilicon. The device formed by the process of the invention displays excellent source/drain to substrate capacitance characteristics as well as improved circuit performance associated with the lowered resistance within the gate. Furthermore, the coplanarity of the tungsten layer upper surfaces above the source, drain, and gate facilitates the latter steps of the device manufacturing sequence, including deposition of a surface insulating layer and provision of external electrical connections.

DETAILED DESCRIPTION OF THE INVENTION

The process of the present invention is depicted in the schematic cross-sections in FIGS. 2A–2F.

Figure 2A:
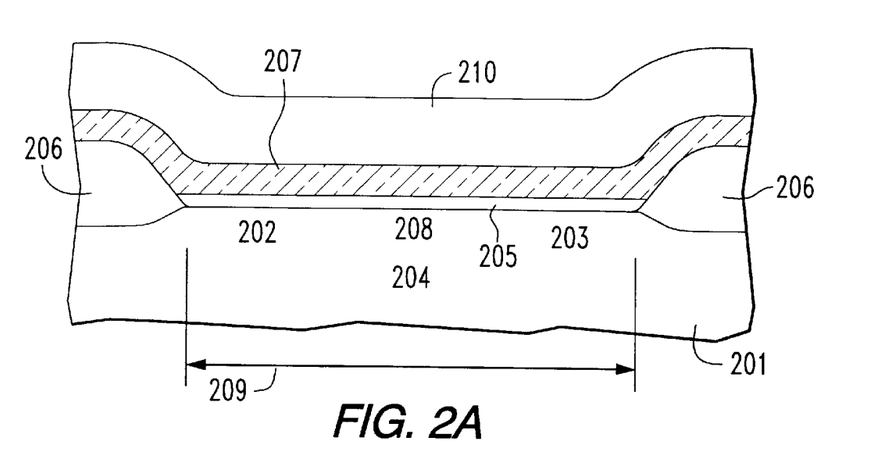
FIG. 2A–2F are schematic cross-sections depicting the process of the invention.

FIG. 2A depicts a substrate 201 that includes a source region 202, a drain region 203, and a channel region 204. Overlying substrate 201 is dielectric surface 205, typically of silicon dioxide and with a thickness of about 80 to 150 angstroms. Also shown is field oxide 206, which surrounds and defines active region 209.

A polysilicon layer 207 is formed on substrate 201. Polysilicon layer 207 has a thickness of about 800 to 1200 angstroms, considerably thinner than the 2500 angstroms typically employed in prior art devices.

A first impurity is implanted into substrate 201 through a portion of the polysilicon layer 207 overlying channel region 204, forming a shallow buried channel 208 between the source region 202 and the drain region 203. Depending on whether the device is a PMOS or an NMOS device, the impurity may be either a p-type dopant or an n-type dopant, respectively.

A silicon nitride layer 210 having a thickness of approximately 3000 angstroms is deposited on polysilicon layer 207. A photoresist pattern (not shown) is formed on nitride layer 210.

Figure 2B:
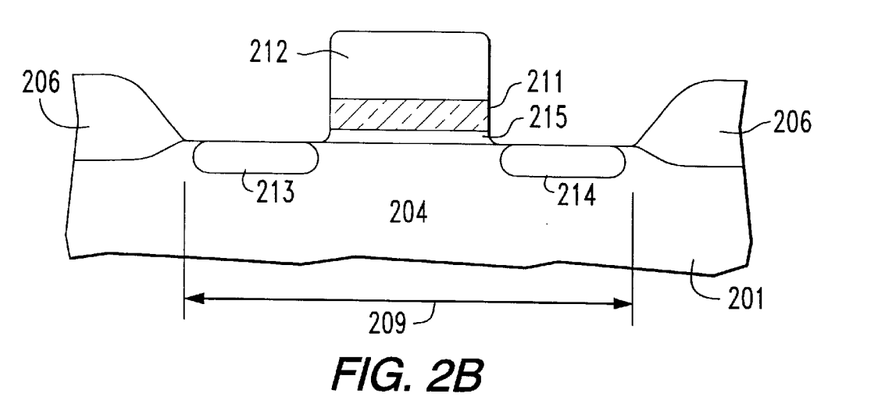

The portions of nitride layer 210 and polysilicon layer 207 not protected by the photoresist pattern are selectively removed by, for example, reactive ion etching (RIE), leaving a gate stack structure comprising gate dielectric surface 215, gate polysilicon layer 211 and gate nitride layer 212, as shown in FIG. 2B. The photoresist pattern is removed, and a second impurity is implanted into source and drain regions 202 and 203, thereby forming source 213 and drain 214, respectively. For a PMOS device, the source/drain impurity is of p conductivity type, for example, a boron dopant at a concentration of about $10^{16}$ to $10^{18}$ atoms $cm^{-3}$. For an NMOS device, the impurity is of n conductivity type, for example, an arsenic or phosphorus-arsenic dopant at a concentration of about $10^{16}$ to $10^{18}$ atoms $cm^{-3}$.

Figure 2C:
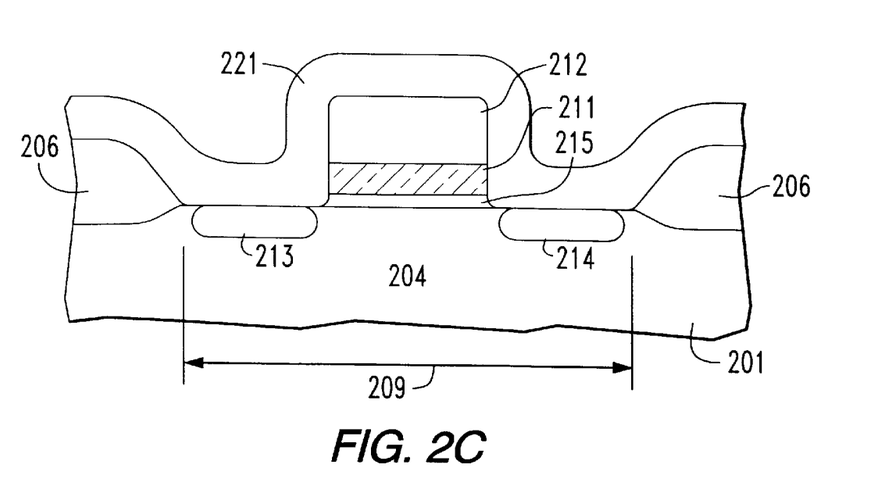

Following the patterning and source/drain implanting operations, a first insulating layer 221 is formed over active region 209, as depicted in FIG. 2C. The thickness of insulating layer 221, which preferably comprises silicon dioxide, is about 3000 angstroms.

First insulating layer 221 is anisotropically etched, preferably by reactive ion etching (RIE), leaving sidewall insulating spacers 221 on both sides of polysilicon layer 211, thereby forming sidewall sealed gate 222. If desired, heavily doped regions (not shown) in source 213 and drain 214 may be optionally formed at this point by further implantation of an impurity.

Figure 2D:
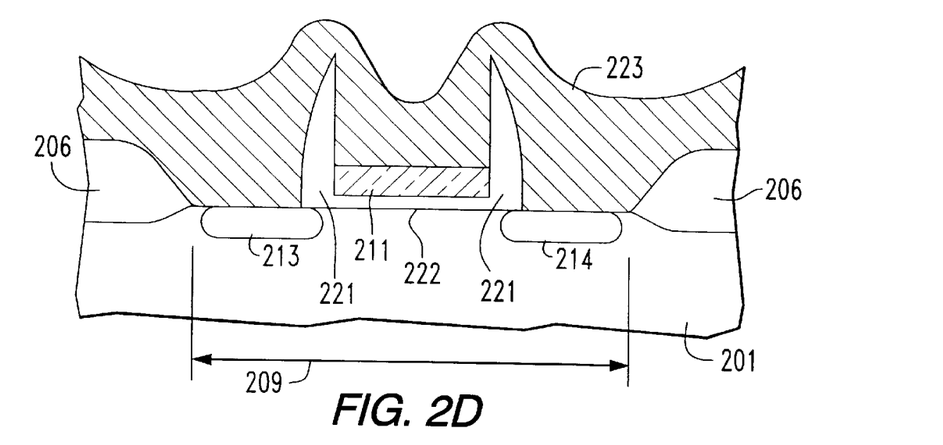

Following removal of silicon nitride layer 212 (FIG. 2C) overlying polysilicon layer 211, a blanket metal layer 223 is deposited over source 213, drain 214, gate 222, and spacers 221 (FIG. 2D). The metal may be, for example, tungsten, titanium, tantalum, molybdenum, platinum, or aluminum, which may be deposited by sputtering or chemical vapor deposition (CVD). In a preferred embodiment, the metal is tungsten, deposited by CVD. The removal of nitride layer 212 may be accomplished by, for example, treatment with phosphoric acid. The deposition of layer 223 may be carried out by, for example, a CVD process utilizing a reducible tungsten compound such as $WF_6$.

Figure 2E:
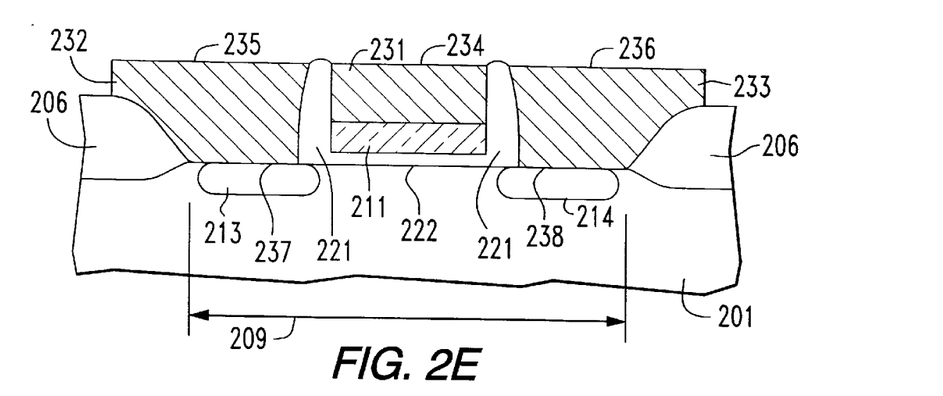

As shown in FIG. 2E, tungsten layer 223 is planarized by, for example, chemimechanical processing that includes polishing the layer using one or more slurries, each containing a mixture of abrasive and etching components. Planarization removes sufficient tungsten to expose sidewall spacers 221 and thereby electrically isolate the tungsten within gate 222 from adjacent tungsten that is in contact with source 213 and drain 214.

Portions of the planarized tungsten layer overlying field oxide 206 are selectively removed by suitable wet or dry etching, using a photoresist layer (not shown) that extends over active area 209 and, preferably, also over a portion of field oxide 206. Second and third portions 232 and 233 of the planarized tungsten layer are thereby formed adjacent first portion 231. First portion 231, which overlies gate polysilicon layer 211, has a thickness of about 1000 to 2000 angstroms and is electrically isolated by exposed sidewall spacers 221 from second portion 232 and third portion 233, which are in contact with source 213 and drain 214, respectively. Second and third portions 232 and 233 preferably extend laterally over field oxide 206. The upper surfaces 234, 235, and 236 of first, second, and third portions 231, 232, and 233, respectively, comprise a substantially coplanar surface.

In a preferred embodiment of the device of the invention, the ratio of the width of the upper surfaces 235 and 236 to the width of the lower surfaces 237 and 238 of second and third portions 232 and 233 is from about 2:1 to 4:1. The width of upper surfaces 235 and 236 is preferably about 400 to 2000 angstroms, the width of lower surfaces 237 and 238 preferably about 200 to 600 angstroms. Also, the widths of source 213, drain 214, and gate 222 are each preferably about 200 to 600 angstroms.

Figure 2F:
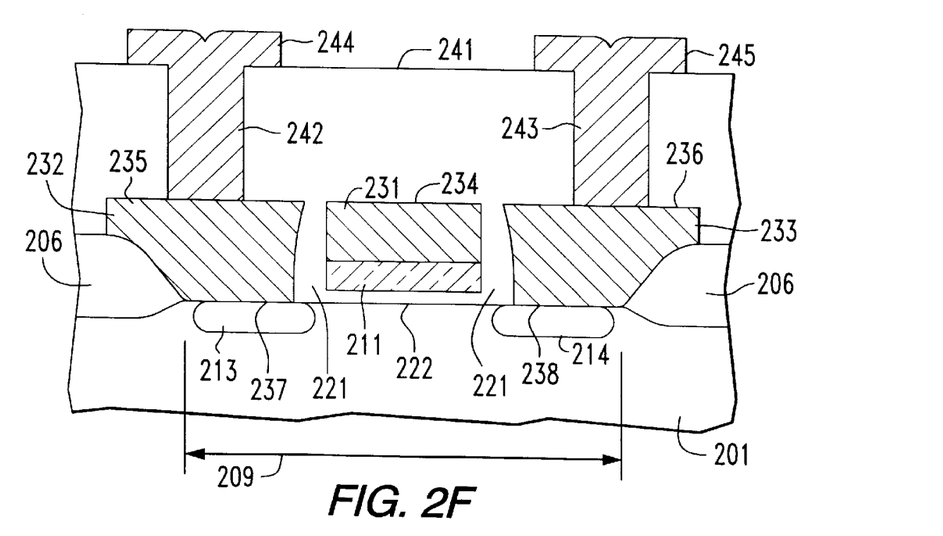

As shown in FIG. 2F, a second insulating layer 241, preferably comprising silicon dioxide and having a thickness of about 1500 to 3500 angstroms, may be deposited over the first, second, and third portions 231, 232, and 233, respectively, of the planarized tungsten layer. Contact holes 242 and 243 are etched through layer 241 to enable external metal contacts 244 and 245, preferably comprising aluminum, to connect with second and third portions 232 and 233, respectively.

Figure 3:
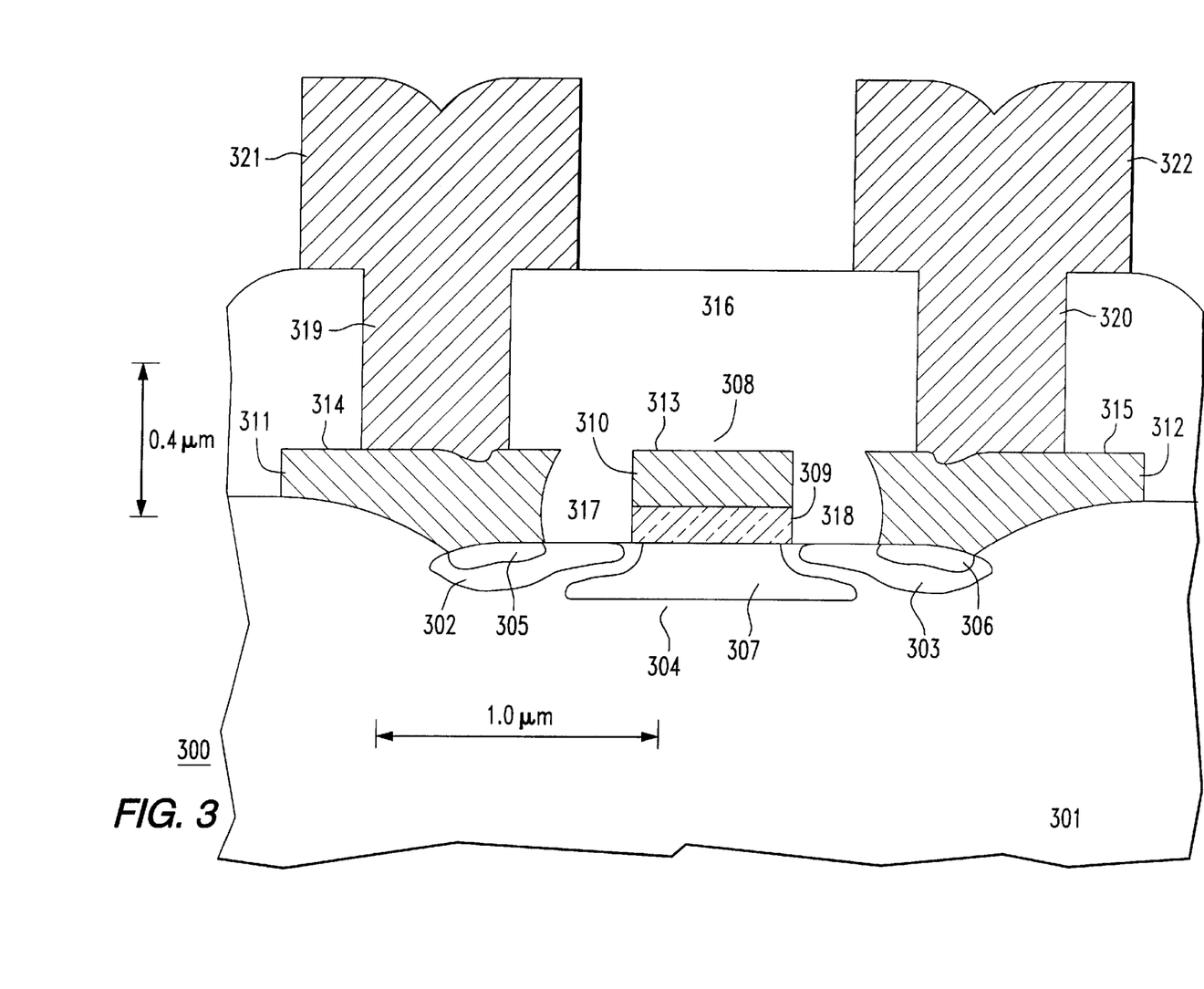
FIG. 3 is a cross-section of a raised source/drain MOS device of the present invention.

FIG. 3 is a cross section, substantially to scale, of a self-aligned raised source/drain MOS device 300 of the present invention, constructed by the ATHENA process simulator program for a device having an 0.5 μm-wide gate with a 0.1 μm-thick polysilicon layer, using the same source/drain doping as that employed for the FIG. 1 device simulation. A substrate 301 comprises a source 302, a drain 303 and a gate region 304. The source 302 and drain 303, each has a width of about 0.8 μm, much reduced relative to the 1.8 μm width of source 102 and drain 103 of the prior art device depicted in FIG. 1. Source 302 and drain 303 may each include a highly doped region 305 and 306, respectively. A buried channel 307 in gate region 304 lies between source 302 and drain 303. Gate 308 includes a gate polysilicon layer 309 that is considerably thinner than typically used in prior art devices; overlying layer 309 is a tungsten layer 310.

Tungsten layer portions 311 and 312 are in ohmic contact with source 302 and drain 303, respectively, and the upper surfaces 313, 314, and 315 of portions 310, 311, and 312, respectively, are coplanar, unlike the corresponding tungsten layer portions of the FIG. 1 device. The present invention provides for tungsten layer portions 311 and 312 to effectively raise source 302 and drain 303 to the same level as portion 310 in gate 308.

A thick insulating layer 316, preferably of silicon dioxide, is formed over tungsten layers 310, 311, and 312 and the insulating spacers 317 and 318 that separate them. Contact holes 319 and 320 through insulating layer 316 enable external contacts 321 and 322 to connect with tungsten layers 311 and 312, respectively.

Compared with a prior art MOS device such as that represented by FIG. 1, the embodiment of the present invention depicted in FIG. 3 offers substantial advantages with respect both to its method of fabrication and its performance characteristics. A single blanket deposition of tungsten simultaneously provides laterally extended and vertically raised source/drain contacts as well as a resistance-lowering metal layer within the gate. Gate masking and etching is controlled to provide reduced active area size and greater packing density, even as alignment tolerances are eased by the laterally extended source-drain contacts. The reduced active area results in improved capacitance characteristics. In addition, the coplanarity of the upper surface of the tungsten layer over the source, drain, and gate facilitates the final stages of the device fabrication process. A further advantage of the device and process of the present invention is attributable to the thin gate polysilicon layer, which allows dopant implantation through the layer to provide a shallow buried channel between the source and the drain.

Figure 4:
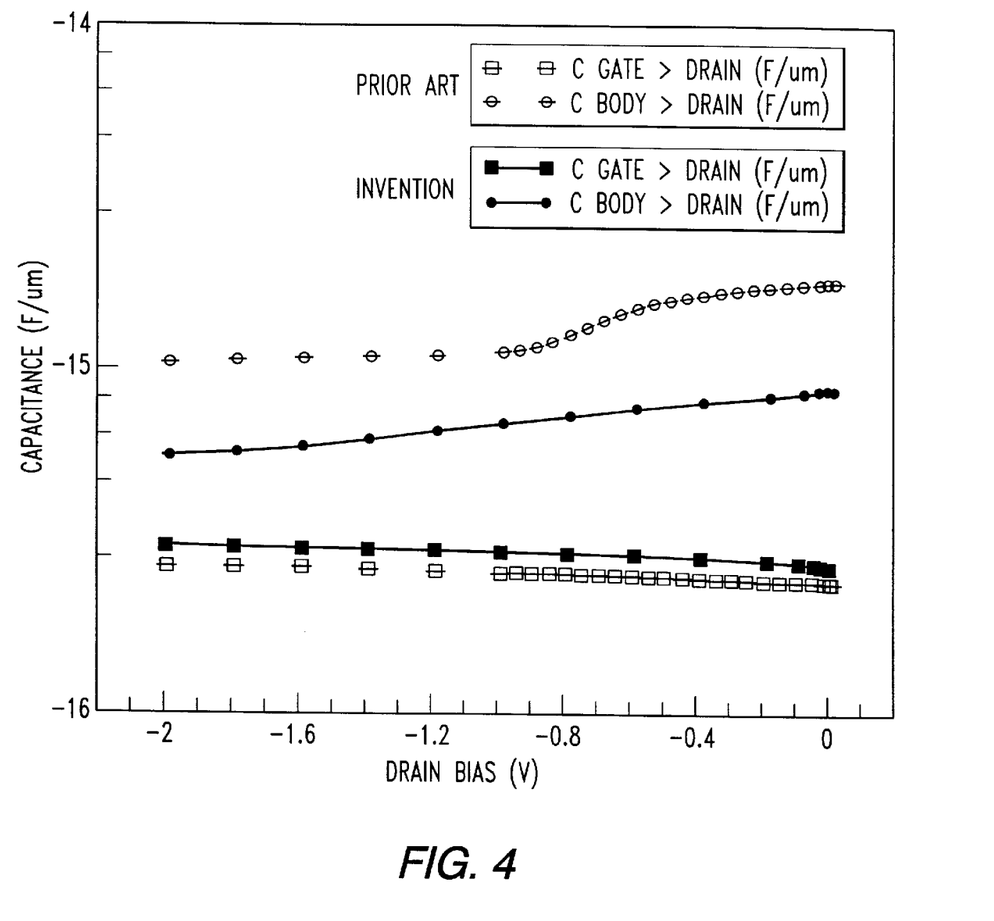
FIG. 4 is a plot comparing simulated capacitance values from a prior art device with those from a device of the present invention.

FIG. 4 is a plot of simulated capacitance values vs. drain bias for a prior art device, represented by FIG. 1, compared with the device of the invention, represented by FIG. 3. Capacitance simulation was carried out using the ATLAS device simulator program available from Silvaco Co. Although the gate/drain capacitance is similar for the two devices, that of the invention demonstrates a desirably lowered body (substrate)/drain capacitance over the entire drain bias range, an advantage that is presumably attributable to the reduced active area in the device of the present invention.

The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. A process for forming a self-aligned raised source/drain MOS device comprising:

on a semiconductor substrate forming spaced apart field oxide regions, a gate disposed between the opposite field oxide regions, said gate having a gate dielectric on the substrate and a gate electrode on the gate dielectric;

forming a source in the substrate between one side of the gate and one field oxide region and forming a drain between the other side of the gate and the other field oxide region;

forming a dielectric sidewall on both sides of the gate;

depositing a uniform layer of metal over the substrate to contact the source, the drain and the gate electrode;

planarizing the layer of metal to expose the dielectric sidewall, to isolate the metal contacting the gate from the metal contacting the source and the drain, and to provide ohmic contacts to the source, gate and drain, each ohmic contact being at substantially the same level as the other ohmic contacts.

2. The process of claim 1 wherein said metal is tungsten.

3. The process of claim 1 wherein the source and drain ohmic contacts extend laterally over a portion of the field oxide regions.

4. The process of claim 1 comprising:

depositing a dielectric layer over said ohmic contacts.

5. The process of claim 4 further comprising:

forming an external metal connection through said dielectric layer to the source and drain ohmic contacts.

6. The process of claim 4 wherein said gate dielectric, said dielectric sidewalls, and said dielectric layer comprise silicon dioxide.

7. The process of claim 1 wherein said depositing the layer of metal is carried out by chemical vapor deposition.

8. The process of claim 7 wherein said layer of metal has a thickness of about 2500 to 3500 angstroms.

9. The process of claim 1 wherein said planarizing the metal layer is carried out by chemimechanical processing.

10. The process of claim 9 wherein said metal layer after said planarizing has a thickness of about 1000 to 2000 angstroms.

11. The process of claim 1 wherein said gate electrode comprises polysilicon.

12. The process of claim 11 wherein said polysilicon gate electrode has a thickness of about 800 to 1200 angstroms.

13. The process of claim 1 wherein said source and drain are of P conductivity type.

14. The process of claim 1 wherein said source and drain are of N conductivity type.

15. A process for forming a self-aligned raised source/drain MOS device comprising:

providing a semiconductor substrate that comprises an active region disposed between spaced apart field oxide regions and comprising a gate channel region that includes a gate dielectric surface on the substrate and source and drain regions disposed on either side of said gate channel region;

forming a polysilicon layer on said gate dielectric surface;

implanting a first impurity into the polysilicon layer and through said polysilicon layer into said substrate, thereby forming a shallow buried channel disposed between said source and drain regions;

depositing a silicon nitride layer over said polysilicon layer;

selectively removing the portion of the silicon nitride and polysilicon layers overlying the source and drain regions, thereby defining a gate stack structure of silicon nitride and polysilicon layers over the gate channel region;

implanting a second impurity into said source and drain regions, thereby forming a source and a drain;

depositing a first insulating layer overlying said source and drain and said gate channel region;

selectively removing portions of said first insulating layer overlying the source and drain and the gate region silicon nitride layer, leaving an insulating sidewall spacer on both sides of said polysilicon layer, thereby forming a sidewall sealed gate;

removing the silicon nitride layer overlying the gate polysilicon layer;

depositing a tungsten layer overlying the source, drain, gate polysilicon layer, and insulating sidewall spacers;

planarizing the tungsten layer, thereby exposing the sidewall insulating spacers and forming a planarized tungsten layer having a substantially planar upper surface, said layer comprising a first portion having a lower surface in contact with said gate polysilicon layer, said first portion of the planarized tungsten layer being electrically isolated by said exposed insulating sidewall spacers from adjacent portions of said planarized tungsten layer;

selectively removing a portion of the planarized tungsten layer overlying said field oxide region, thereby forming a second portion and a third portion of said planarized tungsten layer, each said second and third portion being electrically isolated from said first portion and each having a lower surface in contact with said source and said drain, respectively, the upper surface of said first, second, and third portions of said planarized tungsten layer comprising a substantially coplanar surface.

16. The process of claim 15 wherein the second and third portions of the planarized tungsten layer extend laterally over a portion of the field oxide region.

17. The process of claim 15 further comprising:

depositing a second insulating layer overlying the first, second, and third portions of the planarized tungsten layer.

18. The process of claim 15 further comprising:

following selectively removing the insulating layer from the source, drain, and silicon nitride layer overlying the gate region, implanting a third impurity into said source and said drain.

19. The process of claim 17 further comprising:

forming an external metal connection through the second insulating layer to the upper surface of the second and third portions of said planarized tungsten layer.

20. The process of claim 15 wherein said dielectric surface comprises silicon dioxide.

21. The process of claim 15 wherein said first and second insulating layers comprise silicon dioxide.

22. The process of claim 15 wherein said removing the portion of the silicon nitride layers exposed by the photoresist gate pattern is carried out by reactive ion etching.

23. The process of claim 15 wherein said selectively removing the insulating layer from the source, drain, and silicon nitride layer overlying the gate region is carried out by reactive ion etching.

24. The process of claim 18 wherein said impurities each comprises a p-type dopant.

25. The process of claim 18 wherein said impurities each comprises an n-type dopant.

26. The process of claim 15 wherein the gate polysilicon layer has a thickness of about 800 to 1200 angstroms.

27. The process of claim 15 wherein said removing the silicon nitride layer overlying the gate polysilicon layer is carried out by reacting the silicon nitride with phosphoric acid.

28. The process of claim 15 wherein said depositing the tungsten layer is carried out by chemical vapor deposition.

29. The process of claim 28 wherein the deposited tungsten layer has a thickness of about 2500 to 3500 angstroms.

30. The process of claim 15 wherein said planarizing the deposited tungsten layer is carried out by chemimechanical processing.

31. The process of claim 30 wherein the first portion of the planarized tungsten layer has a thickness of about 1000 to 2000 angstroms.

32. The process of claim 31 wherein the upper and lower surfaces of the second and third portions of the planarized tungsten layer each have a width dimension, the ratio of the width of the upper surface to the width of the lower surface of said second and third portions being from about 2:1 to 4:1.

33. The process of claim 31 wherein the upper surface width of each said second and third portion is about 400 to 2000 angstroms and the lower surface width of each said portion is about 200 to 600 angstroms.

34. The process of claim 21 herein said first insulating layer has a thickness of about 1500 to 3500 angstroms.

35. The process of claim 21 wherein said second insulating layer has a thickness of about 1500 to 3500 angstroms.

36. A self-aligned raised source/drain MOS device comprising:

a semiconductor substrate having a surface with source and drain diffusion regions and a gate region disposed between the source and drain diffusion regions.

said gate region comprising a gate insulating layer in contact with the surface of the substrate and a layer of gate conductive material on the insulating layer;

a planarized metal layer forming raised source drain and gate electrodes, the source and drain electrodes each having a lower surface in ohmic contact with the source and the drain regions, respectively; the source, drain and gate electrodes having an upper surface substantially coplanar with one another, the gate electrode being in ohmic contact with the gate conductive material, a pair of insulating sidewall spacers disposed on opposite sides of the gate conductive material and gate electrode for electrically isolating the gate electrode and the gate conductive material from the source and drain electrodes and the source and drain regions.

37. The MOS device of claim wherein the raised source and drain electrodes each extends laterally over a portion of a field oxide region adjacent said source and drain diffusion regions.

38. The MOS device of claim 37 wherein said upper and lower surfaces of said raised source and drain electrodes each have a width dimension, the ratio of the width of the upper surface to the width of the lower surface being from about 2:1 to 4:1.

39. The MOS device of claim 37 wherein the upper surface width of the raised source and drain electrodes is each about 400 to 2000 angstroms, and the lower surface width of said electrodes is each about 200 to 500 angstroms.

40. The MOS device of claim 36 wherein the gate electrode has a thickness of about 1000 to 2000 angstroms.

41. The MOS device of claim 36 wherein the source and drain each comprises an n-type dopant.

42. The MOS device of claim 36 wherein the source and drain each comprises a p-type dopant.

43. The MOS device of claim 36 wherein the source and drain each has a width of about 200 to 600 angstroms.

44. The MOS device of claim 36 wherein the gate has a width of about 200 to 600 angstroms.

45. The MOS device of claim 36 wherein the gate conductive material is doped polysilicon and has a thickness of about 800 to 1200 angstroms.

46. The MOS device of claim 36 further comprising:
an insulating layer overlying the source, gate and drain electrodes.

47. The MOS device of claim 36 further comprising:
an external metal connection extending through the insulating layer to the upper surface of the source and drain electrodes.

48. The MOS device of claim 47 wherein said external metal connection comprises aluminum.

49. The MOS device of claim 36 wherein the metal of the source, gate and drain electrodes comprises one selected from the group consisting of tungsten, titanium, molybdenum, platinum and aluminum.

* * * * *